United States Patent [19]

Chauvel

[11] Patent Number: 4,623,986
[45] Date of Patent: Nov. 18, 1986

[54] MEMORY ACCESS CONTROLLER HAVING CYCLE NUMBER REGISTER FOR STORING THE NUMBER OF COLUMN ADDRESS CYCLES IN A MULTIPLE COLUMN ADDRESS/SINGLE ROW ADDRESS MEMORY ACCESS CYCLE

[75] Inventor: Gerard Chauvel, Cagnes, France

[73] Assignee: Texas Instruments Incorporated, Dallas, Tex.

[21] Appl. No.: 583,071

[22] Filed: Feb. 23, 1984

[51] Int. Cl.[4] .................... G06F 13/18; G11C 7/00; G11C 8/00
[52] U.S. Cl. .................................. 364/900; 365/203; 365/236
[58] Field of Search ... 364/200 MS File, 900 MS File; 365/239, 240, 193, 236, 222, 203

[56] References Cited

U.S. PATENT DOCUMENTS

| | | | |
|---|---|---|---|
| 4,231,110 | 10/1980 | Stinehelfer | 365/239 X |
| 4,240,138 | 12/1980 | Chauvel | 364/200 |
| 4,394,753 | 7/1983 | Penzel | 365/236 |
| 4,429,375 | 1/1984 | Kobayashi | 365/240 |
| 4,435,792 | 3/1984 | Bechtolsheim | 365/230 |
| 4,482,949 | 11/1984 | Cates | 364/200 |
| 4,485,460 | 11/1984 | Stambaugh | 365/203 |
| 4,485,461 | 11/1984 | Kobayashi | 365/239 |
| 4,523,277 | 6/1985 | Schnathorst | 364/200 |

FOREIGN PATENT DOCUMENTS 087868  9/1983  European Pat. Off. .
406250  5/1979  France .

Primary Examiner—James D. Thomas
Assistant Examiner—Thomas C. Lee
Attorney, Agent, or Firm—Robert D. Marshall, Jr.; N. Rhys Merrett; Melvin Sharp

[57] ABSTRACT

This device permits the distribution of the access to a RAM memory RAM (14) among a plurality of users (U1, U2, U3), the access being effected in an asynchronous manner. Certain users (U2, for example) can access the memory at adjoining addresses by means of a single row precharge cycle, the column access cycles (CAS) being successively effected during a single row (RAS) access cycle. One can thus considerably reduce the access time of the memory (14) when a large quantity of data must be read into the memory or written into it.

Application to teletext terminals where the users of the memory can be the CPU, the video processor, and a teletext data receiver.

8 Claims, 7 Drawing Figures

MEMORY ACCESS CONTROLLER HAVING CYCLE NUMBER REGISTER FOR STORING THE NUMBER OF COLUMN ADDRESS CYCLES IN A MULTIPLE COLUMN ADDRESS/SINGLE ROW ADDRESS MEMORY ACCESS CYCLE

The instant invention relates to a device for distributing a memory access time among a plurality of users.

It is known, in the microprocessor art, to coordinate the reading and writing of a random access memory RAM, with two or more users, one user being the central processing unit CPU, and the other user or users being capable of accessing the memory during the direct access periods of the memory or DMA. For example, if a large amount of data are to be written into the memory, a control circuit DMA directly accesses the memory, without the intervention of the CPU and, above all, without having the CPU cycle controlling access to the memory.

A circuit of this type is described in U.S. Pat. No. 4,240,138 entitled "System for Direct Access to a Memory Associated with a Microprocessor" which claims priority from French patent application No. 77.31140 filed Oct. 17, 1977, in the name of the instant assignee. In this application, two variations in the control of memory access are described, one in which the request to the memory by the CPU and another user is synchronous with the clock of the CPU and, another in which the control takes place in a totally asynchronous manner with respect to this clock, the access to the memory by the various users (including CPU) being controlled as a function of a certain priority. In the case described, it is the CPU which has first priority and each time that it requests access to the memory, it will receive, memory cycle time either immediately, if no other cycle is in progress, or in the following cycle, if a current cycle is assigned to another user, the access demands of other users being held on wait and subsequently processed as a function of their priority. During this process, a user having a higher priority can always intervene to request access which will be obtained over a request of a user having a lower priority.

Known "DMA circuits" (this abreviation will be used hereinafter to designate the circuit according to the invention) provide for memory exploitation with great efficiently despite the presence of a plurality of users. Naturally, the duration of the cycles which are processed by the DMA cannot be shorter than those of the memory itself which are fixed by the particular technology of the system.

It is known that memories integrated on semiconductor chips consist of matrixes of memory cells distributed in rows and columns, which are addressed by row and column addresses. The construction of these memories is such that there is required, for a column or row addressing cycle, a certain "preloading" time necessary for placing the circuits associated with the matrix into a condition of selected read/write. The preloading time of the rows is generally substantially longer than the column preloading time. For example, for a memory access cycle of 250 NS, a time period which is usual in currently available RAM memories, there is required a preloading time of 100 NS for the rows, while, for the columns, a few dozen NS will suffice.

In addition, in modern RAM memories, each row can have a plurality of bytes of memory cells which are addressed separately by the column addresses so that each time it is desired to address a predetermined byte, there will be a complete memory cycle having a long access time for the row and a short access time for the columns. Consequently, when a memory zone of the RAM is loaded at all of these successive addresses, for example in the case of a page memory of a cathode ray tube visualization system, it is necessary to execute for each address a complete memory cycle, which entails that the "row" access time uses up a very large portion of the total time for writing or reading in the memory.

The invention has as an object a control circuit which provides a better distribution, among a plurality of users, of the access time of a memory while also reducing, to the minimum, the reading and writing time of the information into the matrix of this memory.

The invention has as an object an asynchronous control device for access by a plurality of users to a RAM memory, the access of which is controlled by the row and column enabling signals accompanying, respectively, the addresses of the row and column which identify the locations of the memory matrix where the read/write operation is to be effected, this device including, for each user, a processing path for the access requests of the users, the processing paths being interconnected in such a manner that the access requests are answered with the priority in which the users are classified, the device also including a generator circuit which, when an access request is presented, generates a signal, the duration of which determines a complete memory access cycle under control of said enabling signals, this device being characterized in that said generator circuit of said duration signal includes means for allocating, to at least certain of said users, a plurality of column enabling signals for a single row enabling signal.

Because of these characteristics, each complete memory access cycle can be executed by a single row cycle, at the corresponding row address, by means of a row enabling signal, which is maintained during the row preloading time and throughout the duration of one or more column cycles executed with the column addresses incremented therewith, and enabled by column validation signal(s), the number of column cycles per row cycles being determined by the users of the memory.

It is understood that thus, when the data are to be read or written into the memory at contiguous addresses, there will be a considerable time saving as the preloading time for the row is not required, except for a single time period for allowing access to a contiguous series of memory locations. However, the user remains in control of the desired number of column cycles; the user itself can determine if a single column cycle or a plurality of column cycles are necessary, the priority between the users being in all cases respected.

Other characteristics and advantages of the invention will appear in the following description. The figures are presented solely as examples.

Figure 1A:
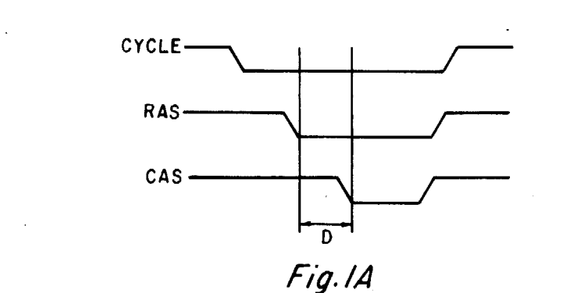
FIGS. 1A and 1B are timing diagrams for the cycles of the memory having a single column access and a plurality of column accesses per row access.

FIG. 1A shows a timing diagram of a simple memory access cycle. During the complete cycle time represented by the cycle signal, there are generated a signal RAS (row address strobe) and a signal CAS (column address strobe) which accompany the row address and the column address which locate a particular byte by an address in the memory matrix. It is seen that the RAS pulse is substantially longer than the CAS pulse by a duration D which represents the difference between the preloading durations of the row and column circuits.

FIG. 1A relates for example to communications between a central processing unit CPU and the memory, where in each read/write operation entails addressing of a single memory cell. This can be otherwise when the memory user is a circuit which requests, for example, the writing of a series of data at numerous successive addresses in the memory, which is the case, for example, of a page memory storing an image for each frame to be displayed on the screen of a sweep frame cathode ray tube. In this case, the data are successively written into the memory at the addresses commencing with the start of a row (first byte), after which the other bytes of the row are distributed, one after another, by incrementation of the column address. At the end of a row, the row address is incremented by one unit to permit the loading of the following row of the memory matrix. It is clear that if there is utilized the conventional addressing system of FIG. 1A, each loading of a byte requires the sum of a preloading time RAS and a preloading time CAS while, in reality, the row address does not change. For this reason, the invention utilizes, in such a case, only a single row addressing for a plurality of column addressing which is seen in FIG. 1B.

Figure 1B:
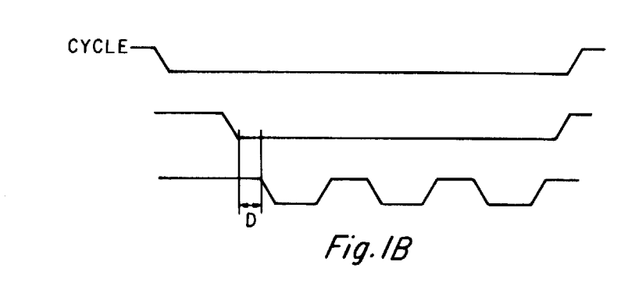

In FIG. 1B, the signal CYCLE is maintained as long as a memory row is loaded, the signal RAS being generated only a single time during this operation and also maintained during the entire cycle. On the other hand, the signal CAS is repeated as many times as necessary (for example, the number of columns which are in the memory). Because of this control, the time for storage of data into a row is substantially shorter and considerable memory access time can be saved.

Figure 2:
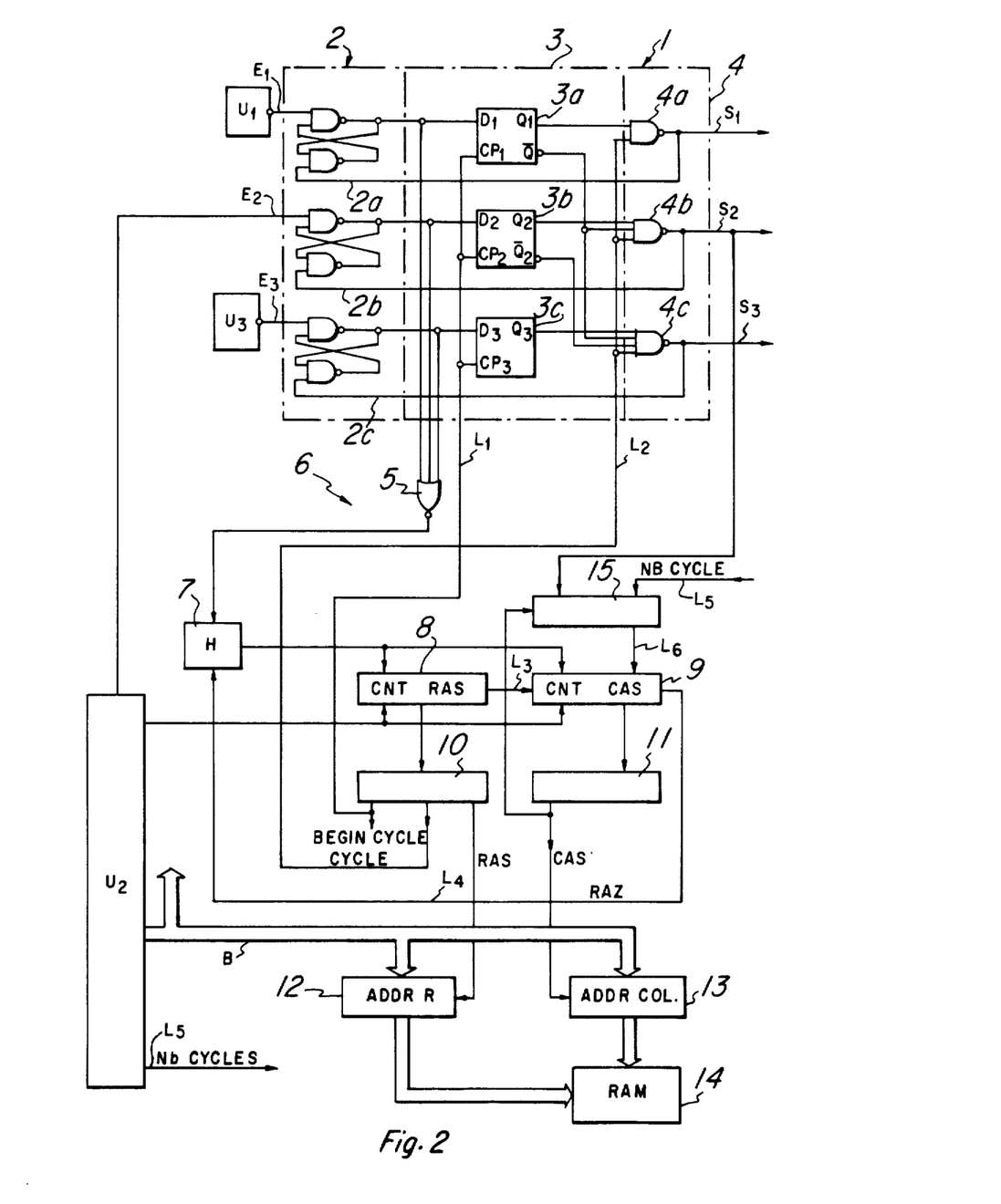
FIG. 2 is a diagram of a DMA circuit according to the invention where there are three users, one of which requires multiple column access.

FIG. 2 shows a DMA circuit which allows the obtainment of an access, in time sharing, to a memory which, according to the type of user, is "monocycle" (FIG. 1A) or þmulticycle" (FIG. 1B). The circuit DMA includes an asynchronous control logic circuit 1 which produces on its outputs S1, S2, S3, cycle signals adapted to allocate to the users U1, U2, U3, access time to the memory RAM, as a function of the access requests which the users present during the operation. The access request signals are applied to inputs E1, E2 and E3 by the users.

As described in the above cited U.S. Pat. No. 4,240,138, the asynchronous control logic circuit includes three essential parts, namely a preliminary memory circuit 2, for the access requests, which is connected to a memory circuit 3 for access requests in progress, this circuit 3 being, in turn, connected to a priority logic 4. The construction and functioning of the logic circuit will be briefly discussed below taking into account the modifications contributed by the invention.

In the embodiment shown, the control logic circuit is a three path circuit. There is no phase relation among the three paths. The outputs of the circuits 2a, 2b, 2c are connected to the inputs of a NOT-OR 5, the output of which is connected to the input of a processing circuit 6 for the signals RAS and CAS.

This circuit 6 is connected, on the one hand, to memory circuits 3a, 3b, 3c for access demands in progress by line L1, and, on the other hand, to an input of each of the three gates NOT-AND 4a, 4b, 4c constituting the three paths of the logic and priority element 4, by line L2 on which circulate the signals "begin cycle" and "cycle" respectively.

Gate 4a is a two input gate, one input being connected to a first output of circuit 3a, the other connected to line L2.

Gate 4b is a three input gate, one input connected to a line L2, another connected to a second output of circuit 3a, and another to the first output of circuit 3b.

Gate 4c is four input gate, one input connected to line L2, and the others connected to outputs of circuits 3a, 3b, 3c.

The circuit thus constructed registers the requests for access to the memory and distributes the requests according to arrival order or priority order.

The path E1S1 has the highest priority, the path E2S2 requires an access of the "multicycle" type, and the paths E1S1 and E3S3 require only "monocycle" access.

When the input E1 is brought to a low level by an access request of the user U1, the RS flip flop 2a changes state, so that the input D1 of the circuit 3a changes to 1, which entails the changing of the state of the output of the NOT-OR gate 5, which causes, by means of circuit 6 to be described hereinafter, the appearance of a pulse on line L1. The leading edge of this pulse is used to register the access demand in the type D flip flop 3a, the output Q1 of which goes to a high level.

The combination of the signal Q1 and the line signal L2 appearing at the inputs of the gate 4a authorize a pulse on output S1.

When S1 is low, the flip flop 2a is reset to its initial state. The line L1 again goes high.

At the end of the memory access cycle, the line L1 is again low and the signal of line L2 again causes the output S1 to go high.

Up until now, the circuit which has been described functions as in the above cited patent application with the signals time spaced and circulating on lines L1 and L2.

There will now be described the other elements of the arrangement which permit the generation of these signals on these two lines L1 and L2 in a manner very different from that described in the above cited U.S. Pat. No. 4,240,138.

The output of the gate NOT-OR 5 is connected to clock 7 which is triggered by a signal at the output of this gate. This clock is connected to two counters 8 and 9 of the RAS and the CAS, respectively. These are connected to decoders 10 and 11, decoder 10 providing a signal "BEGIN CYCLE" (line L1) and a signal "CYCLE" (line L2) and a signal RAS. The decoder 11 generates a signal CAS. The signals RAS and CAS are sent along the appropriate lines to row address buffers 12 and column address buffer 13 for enabling the addresses which were here loaded by address bus B from the users U1, U2, U3, the bus of user U2 being the only one represented in the Figure. The address buffers are connected to memory RAM 14.

Upon reception of a signal from the NOT-OR gate 5, the clock commences to control counter 8 which, after having received a number of pulses corresponding to the preloading time of the row (duration D), triggers, over line L3, the counter 9. The decoder 10 produces signals BEGIN CYCLE and CYCLE, this latter signal being maintained while counter RAS 8 continues to accumulate clock pulses. The counter CAS fills according to the rate of these clock pulses, generating the signal CAS through decoder 11. After having counted the number of pulses corresponding to the duration of a CAS signal cycle, the counter 9 sends a signal RAZ on line L4 to clock 7, which stops the clock.

Meanwhile, the row and column address buffers 12 and 13 have transferred the corresponding addresses to the memory RAM 14 during the signals RAS and CAS, the counter RAS 8 is reset to 0 by line L4, the signal CYCLE is suppressed, and the gate 4a is disabled. At the same time, flip flop 2a is reset to 0.

Assume user U2 loads memory 14 with a plurality of successive column addresses for a single row address. The number of CAS cycles can be controlled by the user itself, the appropriate signal being provided on line L5 which connects the user U2 to a cycle number register 15. This register is enabled by the signal appearing on lead S2 when the output of the gate 4b appears after a memory access request on lead E2 from user U2. The cycle number is loaded into register 15 and it is decremented by a unit each time the signal CAS is produced by counter 9. As long as the register 15 is not emptied, it produces at its output (conductor L6), a signal which inhibits, in counter 9, the output from producing the reset signal on line L4.

The clock 7 will not be blocked after the end of the first cycle CAS and will continue to increment counter RAS 8 and cyclically counter 9 until at the end of the cycle; the signal on line L6 authorizes the production of signal RAZ on line L4 when register 15 is empty.

The production of the signal on lead S2 takes place in an identical manner to that of the signal on lead S1, with appropriate priority being, of course, taken into consideration.

Figure 3:
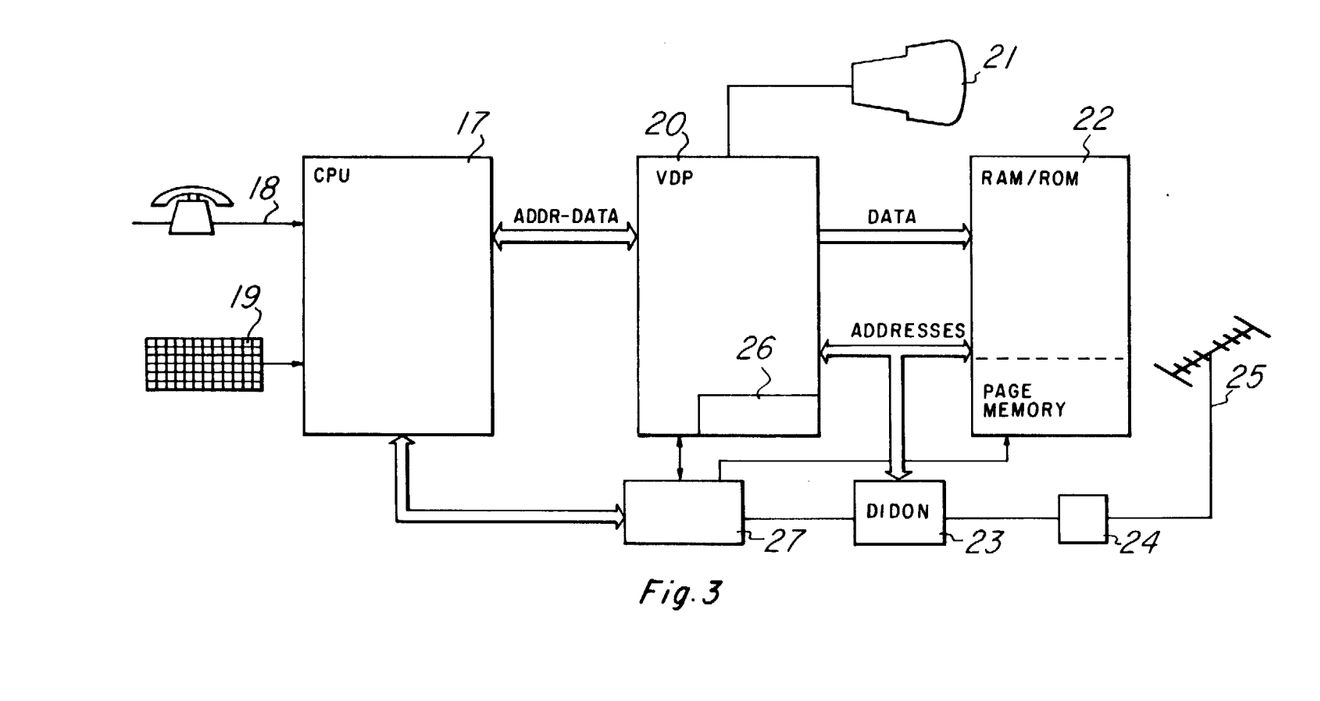
FIG. 3 is a simplified diagram of a teletext terminal, to which the invention finds application.

It is noted that the FIG. 2 circuit allows for the control, in time sharing, of the access to the memory by a plurality of users, and this totally asynchronously and with regard to a particular priority assigned to the users. The users can be part of the same data processing system using a common RAM memory. A particularly appropriate application of the invention is in the field of teletext systems. FIG. 3 shows a very simplified diagram of terminal for a teletext display utilizing, for example, the "antiope" system.

Such a terminal includes a central processing unit CPU 17 which receives instructions and information from a plurality of sources 18 and 19, such as a telephone line or a keyboard. The CPU 17 cooperates with video display processor VDP 20, which prepares the image information by transforming it into a form which can be utilized by a sweep frame cathode ray tube 21. The CPU 17 and the VDP 20 cooperate with a mixed memory RAM/ROM 22, by means of address and data bus. The circuit 23, of the "didon" type, can communicate with the ensemble of the terminal from a receptor station 24 and antenna 25, receiving a television type signal with interlaced teletext information.

The VDP 20 includes a decoder circuit 26 which, depending upon the addresses received from the CPU 17, enables the registers (not shown) of the VDP by placing them selectively into the diverse function modes of image composition, memory loading, video information reception, memory reloading, etc.

The access to the memory by the users (CPU 17, VDP 20, and "didon" 23) is controlled by access control circuit 27, constituted in accordance with the invention, such as the circuit of FIG. 2, it being understood that the circuit here specifically applied to a teletext terminal of the FIG. 3 type.

The access to the memory is here also controlled in an asynchronous manner, as a function of a priority which is established in the following manner:

Priority 1—reading of a byte into the memory under control of CPU 17.

Priority 2—writing of a byte into the memory coming from "didon" circuit 23.

Priority 3—reading of set of bytes into the page memory, each byte belonging to a "memory plane".

Priority 4—writing of a set of bytes into the memory coming from the CPU or another zone of the memory (character generator for example).

It is seen that priorities 3 and 4 entail a loading or a reading of a series of successive bytes which is a case of multicycle operation 8 as described above.

Figure 4:
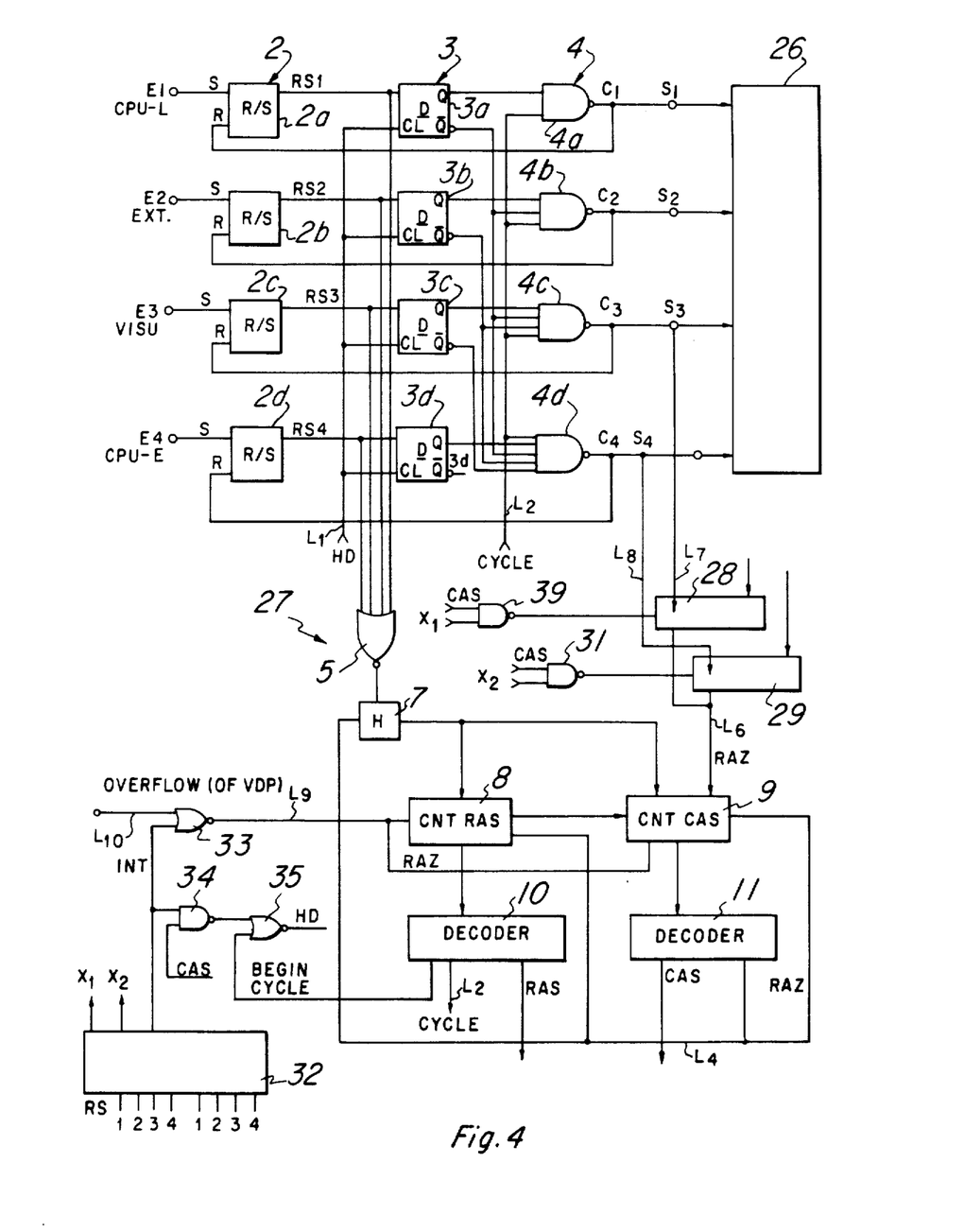
FIG. 4 shows a DMA circuit used in a teletext terminal.

The access control circuit of FIG. 4 ihcludes essentially the same elements as FIG. 2 and these elements have the same reference numbers. There will now be described the elements specifically added for the teletext terminal application.

The cycle number register 15 is here made up of two registers 28 and 29, one for storing a number of "memory planes" and the other for storing a number of writing cycles to be effected when the multicycles are to be effected respectively by paths 3 and 4 of the access control circuit. The registers 28 and 29 are enabled by the signals S3 and S4, respectively, their enabling inputs being connected by lines L7 and L8 to the corresponding leads S3 and S4. Each of the registers includes a 0 output, on which appears a signal when the register is empty, for authorizing the production of the signal RAZ applied to counter CAS, as described in regard to register 15. The registers 28 and 29 are decremented by the NOT-AND gates 39 and 31 which are enabled by the signals CAS and the respective signals X1 and X2 from comparator 32. This comparator includes two sets of inputs which are connected to outputs RS1 to RS4 of the flip flops 2A to 2D and to the outputs of the gates NOT-AND 4A to 4D for comparing the logical levels, and thus, the state of the access requests effected with the access cycles in the course of execution.

The comparator 32 has outputs X1 and X2 connected to gates 39 and 31 and an output INT which is connected to NOT-OR gate 33, the output of which resets to 0 the counters 8 and 9 by line L9. This reset can also be ordered by a signal OVERFLOW on line L10 from the logic and arithmetic unit (not shown) of VDP 20. The signal is generated when an address is loaded into the location of a row corresponding to the last column of the memory. In this case, one would interrupt the loading, increment the row address, and restart the loading with a new column address corresponding to the first cell of the following row designated by the incremented row address.

This signal INT is also combined with the signal CAS in NOT-AND gate 34 which in turn is connected to NOT-OR gate 35, receiving the signal BEGIN CYCLE generated at the proper moment by the decoder 10.

There will now be described the functioning of the circuit of FIG. 4 in connection with the time diagrams of FIGS. 5 and 6.

A—Request CPU—Read (monocycle).

Assume that there is a CPU request for reading a byte in the memory, the signal being thus applied to line E1 (FIG. 4). It is also assumed that the circuit DMA is not executing any request at the moment. The signal on lead E1 generates RSI=1 which is applied to the gate NOT-OR 5, which triggers clock 7. This controls counters 8 and 9, and the decoder 10, associated with counter RAS 8, generates the signal "BEGIN CYCLE", which, passing through NOT-AND 35, produces signal HD on line L1. Signal HD registers the state of flip flops RS1 through RS4 in the associated D flip flops. In the case under consideration here, only the D flip flop 3A produces a "1"at its output Q. The signal CYCLE produced by the decoder 10 is at "1" during the cycle and enables the gate C1 for generating a control signal for circuit 26, which places the appropriate elements of VDP 20 (FIG. 3) into a configuration permitting the direct reading into the memory by the CPU. The output signal of the gate 4A is relooped on the flip flop RSI at the end of the cycle.

If there are a plurality of consecutive requests, or requests in progress, the logical combination of the outputs $\overline{Q}$ of the D flip flops, $3a$ to $3d$, and the gate inputs $4a$ to $4d$, provide the generation of the control signal S1, S2, S3 or S4, having the highest priority (here, in increasing priority, C1-C2-C3-C4).

B—Visu request or CPU—Writing (multicycle).

Such a request entails, for example, the reading or writing of a large number of bits in the page memory. During a VISU request, each bit belongs to a predetermined "memory plane". The term "memory plane" is utilized hereto designate a group of stored bytes, or bytes to be stored, all of them relating to a predetermined color to be displayed. For example, one can have a red, blue or green memory plane, the bytes of each plane not being necessarily contiguous with each other in the memory.

The starting of the multicycle is identical with that of the monocycle, however, during the production of the signal S3 (or S4), the registers 28 or 29 are loaded with a value which, for path 3, is a number of memory planes and, for path 4, a number of CAS cycles. In both cases, a single RAS cycle is necessary for a plurality of CAS cycles. In other terms, the signal CAS is repeated, with its preloading time, as long as counter 28 or 29 does not arrive at 0 because of decrementation by the signal CAS. This decrementation is enabled each time by the signals X1 and X2 via gates 39 and 31 for interrupting the execution of the following group of CAS cycles when a higher priority request is present. This point will be returned to in regard to FIG. 6.

Figure 5:
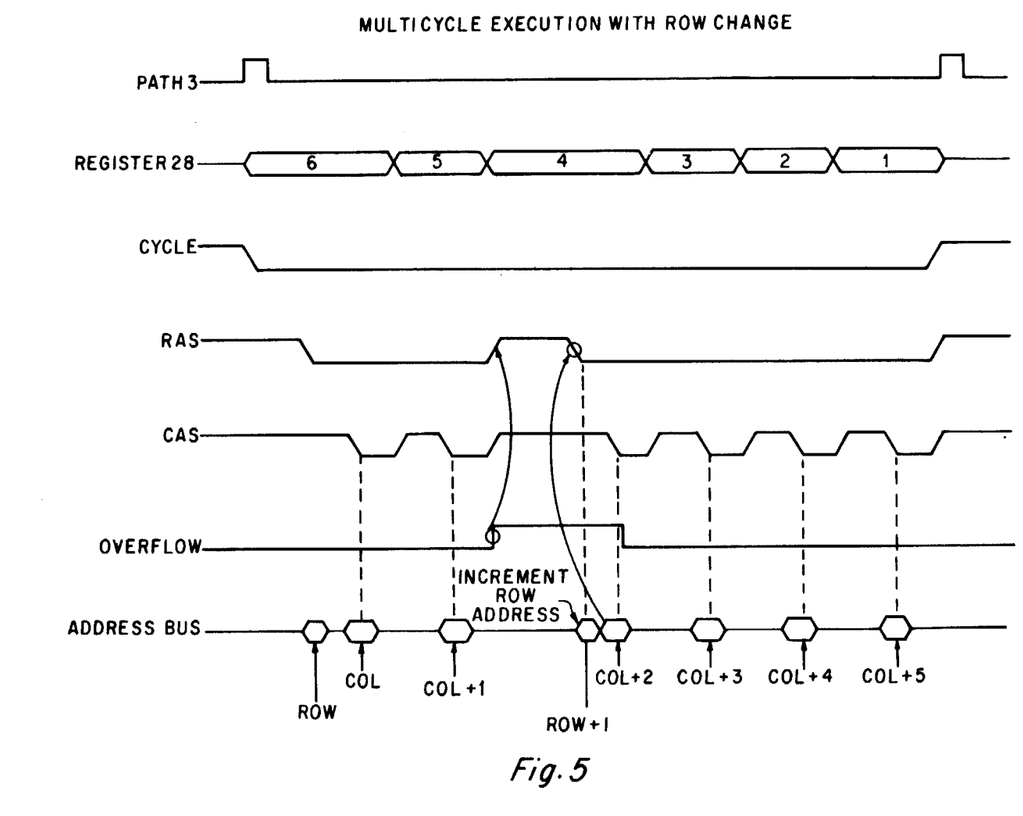
FIG. 5 is a timing diagram of the FIG. 3 circuit.
Figure 6:
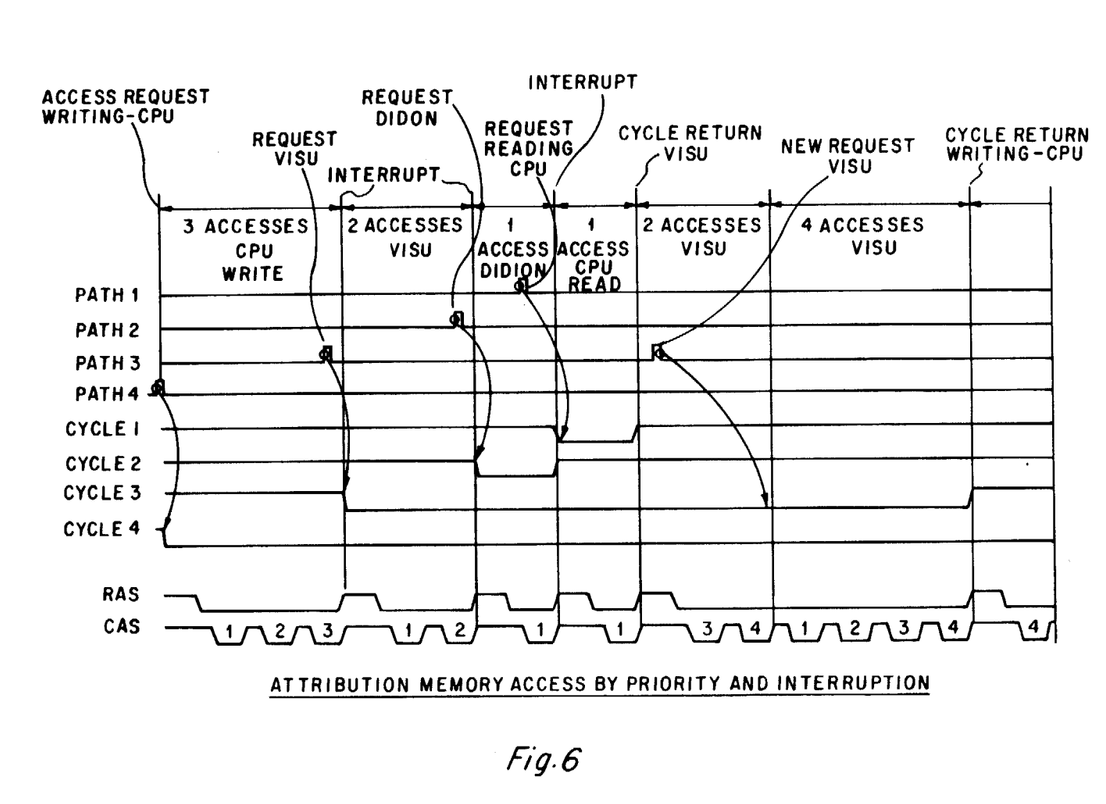
FIG. 6 is another timing diagram of the FIG. 3 circuit.

FIG. 5 shows a timing diagram of a multicycle execution with 6 memory planes, this number 6 being stored in counter 28. The same FIG. 5 illustrates the passage from one row to another when the column address corresponds to the last address of a row (here when the counter 28 has been decremented twice). When the last column address of a row is reached, the circuit ALU of the VDP 20 provides the signal overflow which, by means of gate 33, resets the counters 8 and 9 to 0, in synchronism with clock 7 for a new RAS cycle. The address of the row are incremented by 1 and the new CAS cycles are executed successively, until the counter 28 goes to 0. It is seen that the decrementing of this counter is provisionally stopped during the passage from one row to the following and, after this passage, the signal CAS, successively produced, continues to decrement counter 28, which registers the number (4) of CAS cycles remaining to be executed.

In a general manner, when a request over path 4 is triggered (CPU writing), a large number of CAS cycles is necessary for a single RAS cycle. However, this does not prevent the intervention of a higher priority user to the access of the memory. For example, in the context of a teletext system, the path 2 allows the reception of exterior information, which information provides the material to be displayed, and this path is entirely essential if one does not wish to lose the message information to be transmitted. Thus, path 2 (didon circuit 23) requests writing into the memory of a byte each 1.3 microseconds, and such a byte must not be lost.

The DMA circuit according to the invention can interrupt a multicycle request in the process of execution if a higher priority path requests access to the memory. This is seen in FIG. 6. In this example, the circuit initially satisfies a request on path 4 to execute writing by the CPU into memory. Thus, three CAS cycles are executed. At the end of the third CAS cycle of path 4, another request is presented on path 3 which causes the production of the signal INT, applied to gate 33, by comparator 32. This comparator continually compares the state of the flip flops RS1 to RS4 (requests made), with the state of the outputs of gates C1 to C4 (cycles in the process of execution). If the binary number applied to inputs RS of the comparator 32 is not higher than those on inputs C, the comparator produces the signal INT resetting to 0 the counters 8 and 9 and precluding all new passages of the signal CAS via the gates 39 and 31 by the signals X1 and X2. The signal INT, as the signal OVERFLOW previously, generates the signal HD which allows the registration of the new state of the RS flip flops in the D flip flops when the signal CAS, in course goes high.

The circuit DMA provides for access in two cycles to path 3 (in the case represented in FIG. 6), after which another request having an even higher priority is presented. After a memory cycle permitting the memorization of a bit of path 2 (didon), another higher priority request is presented by the CPU (reading). Thus, there are successively executed, in the same manner, with consideration of the priorities, two CAS cycles of the path 3 which are not executed previously when the request of path 2 was presented, four cycles of the path 3 initiated by the new access request of this path, then, the return to the cycles of path 4 in a plurality of cycles. Naturally, at each interruption of a multicycle, the number of CAS cycles remaining to be executed remains memorized in the corresponding counter 28 or 29.

I claim:

1. A memory access controller for controlling access of a plurality of memory users to a random access memory whose access is by a row address during a row address strobe signal and a column address during a column address strobe signal, at least one of said memory users being a multicycle memory user permitted a plurality of column address strobe signals and a plurality of column addresses corresponding to a single row address strobe signal and a single row address, said memory access controller comprising:

a priority controller connected to each memory user for receiving memory access request signals from said memory users, for generating a memory access signal upon receipt of a memory access request signal from any memory user and for generating a memory access granted signal to a single memory user thereby granting memory access to said single memory user dependent upon a priority of access assigned to said memory users; and a time signal generator circuit connected to said priority controller having
- a memory cycle signal generator for generating a memory cycle signal beginning upon receipt of said memory access signal from said priority conroller and ending upon completion of the memory access cycle,
- a row address strobe signal generator for generating said row address strobe signal beginning no earlier than receipt of said memory access request signal from said priority controller and ending upon completion of the memory access cycle,
- a column address strobe signal generator for generating said column address strobe signal beginning a predetermined period of time greater than the row address precharge time of aid random access memory after the beginning of said row address strobe signal and lasting a predetermined period of time, and
- a cycle number memory connected to said multicycle memory user and said column address strobe signal generator for storing therein a cycle number generated by the multicycle user which indicates the number of such plural column address strobe cycles, for decrementing said number at the end of each column address strobe signal and activating said column address strobe signal generator to generate another column address strobe signal when said number stored in said cycle number memory is nonzero, whereby the end of said column address strobe signal when said number stored in said cycle number memory is zero is the completion of said memory access cycle.

2. A memory access ontroller as claimed in claim 1, further comprising:
- a row address buffer connected to said random access memory, each memory user and said row address strobe signal generator for storing a row address generated by said memory user granted memory access and applying said row address stored therein to said random access memory upon receipt of said row address strobe signal; and
- a column address buffer connected to said random access memory, each memory user and said column address strobe signal generator for storing a column address generated by said memory user granted memory access and applying said column address stored therein to said random access memory upon receipt of said column address strobe signal, said multicycle memory user generating sequential column addresses for each column address strobe signal.

3. A memory access controller as claimed in claim 2, further comprising:
- an overflow device connected to said multicycle memory user for receiving an overflow signal indicating the last column of a memory row from said muticycle memory user;
- an interruption device connected to said overflow device, said memory cycle signal generator, said row address strobe signal generator and said column address signal generator for interrupting a multicycle memory access cycle by ending said memory cycle signal, said row address strobe signal and said column address strobe signal upon receipt of said overflow signal and restarting said multicycle memory access cycle by reactuation of said memory cycle generator, said row address strobe generator, thereby requiring an updated row address from said multicycle memory user, and said column address strobe generator without changing said number stored in said cycle number memory.

4. A memory access controller as claimed in claim 3, further comprising:
- a second interruption device connected to said priority controller for interrupting a multicycle memory access cycle by ending said memory cycle signal, said row address strobe signal and said column address signal upon receipt of a memory access request from a memory user having a higher priority than said multicycle memory user.

5. A memory access controller as claimed in claim 4, wherein:
- said second interruption device inhibits decrementing said number stored in said cycle number memory during the memory access cycle of said higher priority memory user and restarts said multicycle memory access cycle by reactuation of said memory cycle generator, said row address strobe generator, thereby requiring an updated row address from said multicycle memory user, and said column address strobe generator without changing said number stored in said cycle number memory upon completion of said memory access cycle of said higher priority memory user.

6. A memory access controlling system for controlling access of a plurality of memory users at least one of said memory users being a multicycle memory user permitted a plurality of column address cycles corresponding to a single row address, said memory access controlling system comprising:
- a random access memory having data stored at memory locations accessed by a row address during a row address strobe signal and a column address during a column address strobe signal;
- a priority controller connected to each memory user for receiving memory access request signals from said memory users, for generating a memory access signal upon receipt of a memory access request signal from any memory user and for generating a memory access granted signal to a single memory user thereby granting memory access to said single memory user dependent upon a priority of access assigned to said memory users;
- a time signal generator circuit connected to said priority controller having
  - a memory cycle signal generator for generating a memory cycle signal beginning upon receipt of said memory access signal from said priority controller and ending upon completion of the memory access cycle,
  - a row address strobe signal generator for generating said row address strobe signal beginning no earlier than receipt of said memory access request signal from said priority controller and ending upon completion of the memory access cycle,
  - a column address strobe signal generator for generating said column address strobe signal beginning a predetermined period of time greater than the row address precharge time of said random access memory after the beginning of said row address strobe signal and lasting a predetermined period of time, and a cycle number memory connected to said multicycle memory user and said column address strobe signal generator for storing therein a cycle number generated by the multicycle user which indicates the number of such plural column address strobe cycles, for decrementing said number at the end of each column address strobe signal and activating said column address strobe signal generator to generate another column address strobe signal when said number stored in said cycle number memory is nonzero, whereby the end of said column address strobe signal when said number stored in said cycle number memory is zero is the completion of said memory access cycle;

a row address buffer connected to said random access memory, each memory user and said row address strobe signal generator for storing a row address generated by said memory user granted memory access and applying said row address stored therein to said random access memory upon receipt of said row address strobe signal; and a column address buffer connected to said random access memory, each memory user and said column address strobe signal generator for storing a column address generated by said memory user granted memory access and applying said column address stored therein to said random access memory upon receipt of said column address strobe signal, said multicycle memory user generating sequential column addresses for each column address strobe signal.

7. A memory acess controlling system as claimed in claim 6, further comprising:

an overflow device connected to said multicycle memory user for receiving an overflow signal indicating the last column of a memory row from said multicycle memory user;

an interruption device connected to said overflow device, said memory cycle signal generator, said row address strobe signal generator and said column address signal generator for interrupting a multicycle memory access cycle by ending said memory cycle signal, said row address strobe signal and said column address strobe signal upon receipt of said overflow signal and restarting said multicycle memory access cycle by reactuation of said memory cycle generator, said row address strobe generator, thereby requiring an updated row address from said multicycle memory user, and said column address strobe generator without changing said number stored in said cycle number memory.

8. A memory access controlling system as claimed in claim 7, further comprising:

a second interruption device connected to said priority controller for interrupting a multicycle memory access cycle by ending said memory cycle signal, said row address strobe signal and said column address signal upon receipt of a memory access of said higher priority memory user and restarting said multicycle memory access cycle by reactuation of said memory cycle generator, said row address strobe generator, thereby requiring an updated row address from said multicycle memory user, and said column address strobe generator without changing said number stored in said cycle number memory upon completion of said memory access cycle of said higher priority memory user.

* * * * *